(12) United States Patent
Hundemer et al.

(10) Patent No.: US 8,953,891 B1
(45) Date of Patent: Feb. 10, 2015

(54) SYSTEMS AND METHODS FOR IDENTIFYING A BLACK/NON-BLACK FRAME ATTRIBUTE

(71) Applicant: Tribune Broadcasting Company, LLC, Chicago, IL (US)

(72) Inventors: Hank J. Hundemer, Bellevue, KY (US); Dana A. Lasher, Morgan Hill, CA (US)

(73) Assignee: Tribune Broadcasting Company, LLC, Chicago, IL (US)

( * ) Notice: Subject to any disclaimer, the term of this patent is extended or adjusted under 35 U.S.C. 154(b) by 362 days.

(21) Appl. No.: 13/629,405

(22) Filed: Sep. 27, 2012

Related U.S. Application Data

(60) Provisional application No. 61/542,077, filed on Sep. 30, 2011, provisional application No. 61/542,103, filed on Sep. 30, 2011.

(51) Int. Cl.
*G06K 9/46* (2006.01)
*H04N 9/80* (2006.01)
*H04N 5/14* (2006.01)

(52) U.S. Cl.
CPC ..................... *G06K 9/4661* (2013.01)
USPC ............................ 382/190; 386/250; 348/700

(58) Field of Classification Search
CPC ........................... H04N 5/147; G06K 9/00711
USPC ............................ 382/190; 348/700; 386/250
See application file for complete search history.

(56) References Cited

U.S. PATENT DOCUMENTS

| | | | |
|---|---|---|---|
| 6,195,458 B1 | 2/2001 | Warnick et al. | |
| 6,606,409 B2 | 8/2003 | Warnick et al. | |
| 6,721,361 B1 | 4/2004 | Covell et al. | |
| 6,724,933 B1 | 4/2004 | Lin et al. | |
| 6,778,224 B2 | 8/2004 | Dagtas et al. | |
| 7,251,413 B2 * | 7/2007 | Dow et al. | 386/248 |
| 7,676,820 B2 * | 3/2010 | Snijder et al. | 725/19 |
| 8,886,014 B2 * | 11/2014 | Kusunoki et al. | 386/249 |
| 2006/0026628 A1 | 2/2006 | Wan et al. | |
| 2009/0249386 A1 | 10/2009 | Shan et al. | |

* cited by examiner

*Primary Examiner* — Kathleen Y Dulaney
(74) *Attorney, Agent, or Firm* — McDonnell Boehnen Hulbert & Berghoff LLP

(57) ABSTRACT

Presently described are systems and methods for identifying a black/non-black attribute of a current frame. One example embodiment takes the form of a method including the steps of (i) receiving the current frame, (ii) defining a region of the current frame, the region having a plurality of lumas, (iii) calculating a non-black luma percentage of the region based on the lumas, (iv) calculating a white luma percentage of the region based on the lumas, (v) calculating an average luma of the region based on the lumas, and (vi) identifying the current frame as having a black attribute responsive to three conditions being satisfied: the average luma being less than a max-black luma threshold, the non-black luma percentage being less than a non-black luma percentage threshold, and the white luma percentage being less than a white luma percentage threshold.

20 Claims, 5 Drawing Sheets

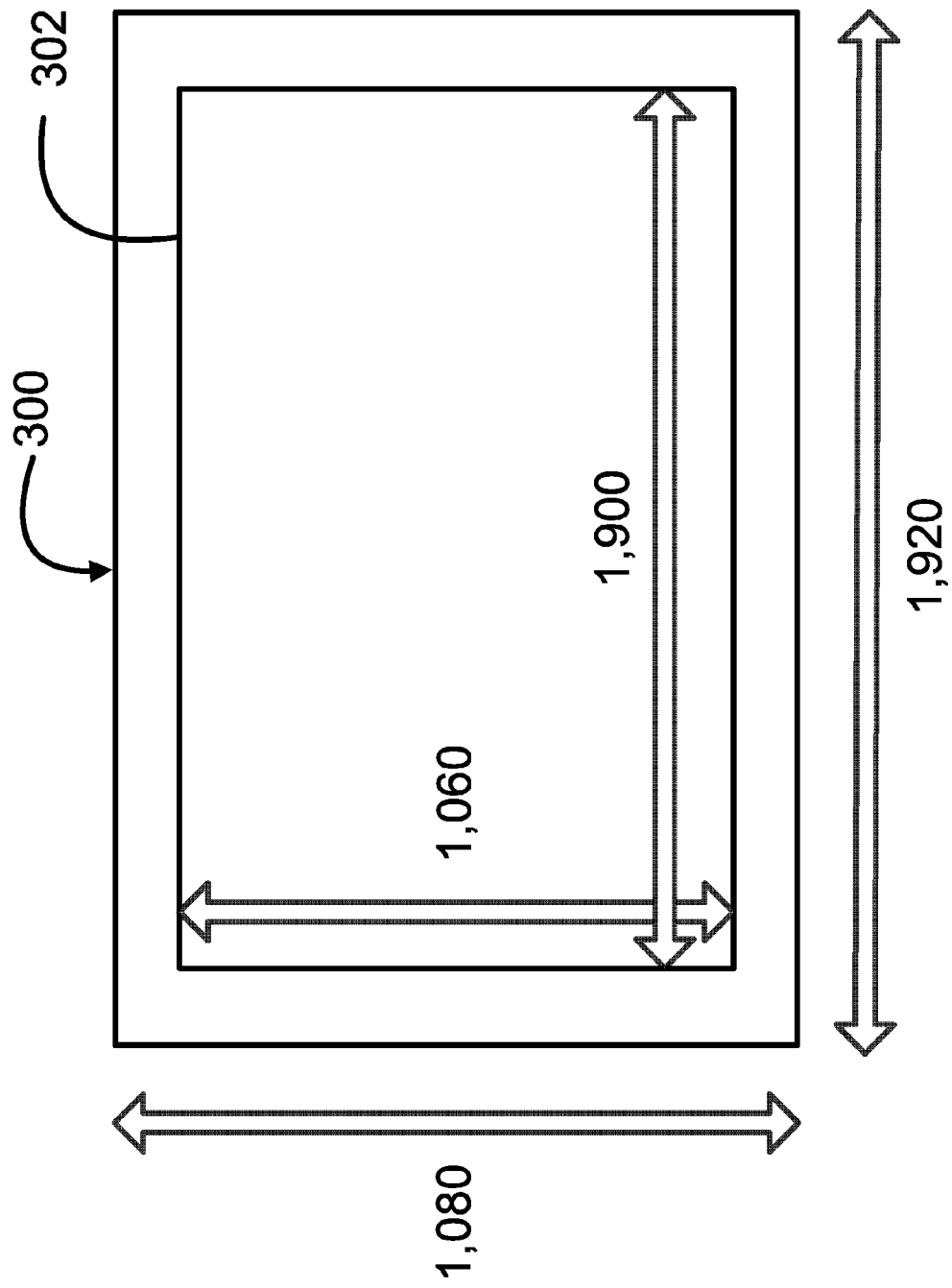

| LUMA VALUE | COUNT |
|---|---|
| 0 | 3 |
| 1 | 20 |
| 2 | 2 |
| 3 | 0 |
| ... | ... |
| 252 | 30 |
| 253 | 5 |
| 254 | 0 |
| 255 | 40 |

US 8,953,891 B1

SYSTEMS AND METHODS FOR IDENTIFYING A BLACK/NON-BLACK FRAME ATTRIBUTE

CROSS REFERENCE TO RELATED APPLICATIONS

This application claims priority to U.S. Provisional Patent Application Ser. No. 61/542,077, entitled "System and Method for Automated Video Content Tagging," filed on Sep. 30, 2011 and U.S. Provisional Patent Application Ser. No. 61/542,103, entitled "System and Method for a Master Controller," filed on Sep. 30, 2011, both of which are hereby incorporated by reference herein in their entirety.

This application also relates to U.S. patent application Ser. No. 13/629,481, entitled "Systems and Methods for Identifying a Colorbar/Non-Colorbar Frame Attribute," U.S. patent application Ser. No. 13/629,495, entitled "Systems and Methods for Identifying a Video Aspect-Ratio Frame Attribute," U.S. patent application Ser. No. 13/629,446, entitled "Systems and Methods for Identifying a Scene-Change/Non-Scene-Change Transition Between Frames," U.S. patent application Ser. No. 13/629,430, entitled "Systems and Methods for Identifying a Mute/Sound Frame Attribute," and U.S. patent application Ser. No. 13/629,497, entitled "Systems and Methods for Electronically Tagging a Video Component in a Video Package," all of which are commonly assigned to the assignee of the present application, are filed simultaneously, and are hereby incorporated by reference herein in their entirety.

USAGE AND TERMINOLOGY

Throughout this application, with respect to all reasonable derivatives of such terms, and unless otherwise specified (and/or unless the particular context clearly dictates otherwise), each usage of:

"a" or "an" is meant to read as "at least one."

"the" is meant to be read as "the at least one."

the term "video" refers broadly to any material represented in a video format (i.e., having a plurality of frames). In some instances, video may include a plurality of sequential frames that are identical or nearly identical, and that may give the impression of a "still" image. Video may also include frames that merely show a black screen, colorbars, testing data, or other traditionally non-substantive content. It should be noted that while non-substantive content may have little or no utility to a typical viewer, it provides useful information for the purpose of the techniques described throughout this disclosure. Video may or may not include an audio portion.

the term "video component" (VC) refers to video that one of ordinary skill in the art would typically consider to be self-contained, and that is typically separately scheduled by a scheduling-and-sequencing system (also commonly referred to as a traffic system) in a broadcasting environment. There are several types of VCs, including for example a show-segment VC, a barter VC, and a promotion VC. A show-segment VC consists of at least a portion of a show, and potentially one or more commercials, all of which are grouped together and considered as one unit for the purpose of scheduling-and-sequencing. A show may be, for example, an episode of a sitcom, a news program, or a movie. A barter VC consists of one or more commercials, all of which are grouped together and considered as one unit for the purpose of scheduling-and-sequencing. A barter VC is a subset of a show-segment VC, namely the portion including the one or more commercials. A promotion VC consists of a promotion or advertisement (e.g., for an associated show).

the term "video package" refers to a collection of VCs and other video, all of which has a logical or other relationship or association. Typically, the video package includes a plurality of sequentially ordered VCs that are separated by other video (e.g., black frames), although the video package may have the technical appearance of being a single, continuous piece of video when analyzed using traditional methods. Each video package includes at least one, and often a group of show-segment VCs that are intended to be aired during a corresponding thirty-minute, one-hour, two-hour, or other predefined time slot. Though not required, a video package is often created by a show syndicator and provided to a broadcaster.

TECHNICAL FIELD

The presently disclosed systems and methods relate to video analysis, and more particularly, to systems and methods for identifying a black/non-black frame attribute.

BACKGROUND

Video technology relates to electronically capturing, processing, recording, and reconstructing a sequence of still images referred to as frames, so as to represent motion. Video includes a number of frames based on a predefined frame rate. For example, in the U.S., the Advanced Television Systems Committee ("ATSC") establishes a standard frame rate of 29.97 frames/second for video used for commercial broadcasting.

For video transmitted via a digital video signal (e.g., based on the high definition serial digital interface (HD-SDI) standard), each frame is represented by a number of pixels commonly described as the smallest unit of an image that can be represented or controlled. The number of pixels in a frame is based on a predefined resolution of the frame (typically defined by a number of columns and rows of pixels). For example, a frame having a resolution of 1,920 columns and 1,080 rows is referred to as 1,920×1,080 and is represented by the arithmetic product of approximately 2,073,600 pixels. Pixels have many attributes, including for example, chrominance values that represent color, and luma values (referred to herein as lumas) that represent brightness. Once captured and processed, video is typically encoded and recorded as a digital file. Thereafter, the file is retrieved and the video is reconstructed by decoding the file.

For a variety of reasons, such as to assist with video editing, it is generally considered useful and helpful to analyze video frames and identify select frame attributes. For example, consider a video package associated with a traditional television show, having multiple show-segment VC (i.e., portions of a "main" show) and intervening barter VCs. Digital video recorders (DVRs) that are configured to record video may seek to analyze the video package to identify the barter VCs, thus allowing for the automatic skipping of commercials when a user watches the recorded video package. One technique for doing this relies on the identification of one or more frames having a "black" frame attribute, wherein the frames represent a short black (or generally black) break between a show-segment VC and a barter VC in a video package.

A traditional approach for identifying a black frame attribute involves decoding a video file and analyzing pixels of a given frame. In one approach, a black frame attribute is identified if all (or a majority) of pixels in the frame are deemed black (i.e., based on the corresponding pixel's chrominance value). However, due to the presence of static or noise in a frame (that may result in random white or gray pixels), this approach often fails to properly identify select frames as having a black frame attribute (i.e., it provides false-negative results). To address such issues, other approaches have been employed that calculate an average pixel luma value of an entire frame. While this approach may reduce false-negative results, it often causes the opposite and undesired effect of providing false-positive results. For example, certain frames that are primarily black, but that include some traditionally substantive content (e.g., a gray moon or white movie credits on a black background), and that are not intended to be identified as having a black frame attribute, are often inaccurately identified as such.

In addition to the issues of false-negative and false-positive results, traditional approaches for identifying black frame attributes also require considerable system resources, particularly if chrominance values are analyzed. Among other things, such approaches require a significant amount of memory and processor utilization, which may result in relatively slow execution.

SUMMARY

Disclosed herein are systems and methods for identifying a black/non-black frame attribute; the disclosed systems and methods improve upon traditional approaches, including those described above.

One example an advantage of the presently disclosed systems and methods is the ability to identify a black/non-black frame attribute while minimizing or eliminating false-positive and false-negative results.

Another example advantage of the presently disclosed systems and methods is the ability to identify a black/non-black frame attribute while minimizing the use of system resources.

Another example advantage of the presently disclosed systems and methods is the ability to identify a black/non-black frame attribute for a plurality of frames of video while contemporaneously processing each frame to create an encoded file, and wherein corresponding steps for each frame are performed during an execution time period that is less than a reciprocal of a frame rate of the video.

Various embodiments of the presently disclosed systems and methods may have none, some, or all of these advantages. Other advantages will be readily apparent to one of ordinary skill in the art.

A first example embodiment takes the form of a non-transitory computer-readable medium containing instructions that, when executed by a processor, cause a set of steps to be carried out for identifying a black/non-black attribute of a current frame. The set includes the steps of (i) receiving the current frame, (ii) defining a region of the current frame, the region having a plurality of lumas within a luma range, (iii) calculating a non-black luma percentage of the region based on the lumas and a max-black luma threshold, (iv) calculating a white luma percentage of the region based on the lumas and a min-white luma threshold, (v) calculating an average luma of the region based on the lumas, (vi) identifying the current frame as having a black attribute responsive to three conditions being satisfied, the first of the three conditions being that the average luma is less than the max-black luma threshold, the second of the three conditions being that the non-black luma percentage is less than a non-black luma percentage threshold, and the third of three conditions being that the white luma percentage is less than a white luma percentage threshold, and (vii) storing an indication of an associated black/non-black frame attribute in a memory.

A second example embodiment takes the form of a frame-processing device that includes a processor and the non-transitory computer-readable medium described in the preceding paragraph.

A third example embodiment takes the form of the method described two paragraphs above this one, where the current frame is received from a source device.

BRIEF DESCRIPTION OF THE DRAWINGS

For a more complete understanding of the presently disclosed systems and methods, reference is now made to the following descriptions, taken in conjunction with the accompanying drawings in which:

FIG. 3 depicts an example of a frame and a region in accordance with at least one embodiment.

DETAILED DESCRIPTION OF THE DRAWINGS

Figure 1:
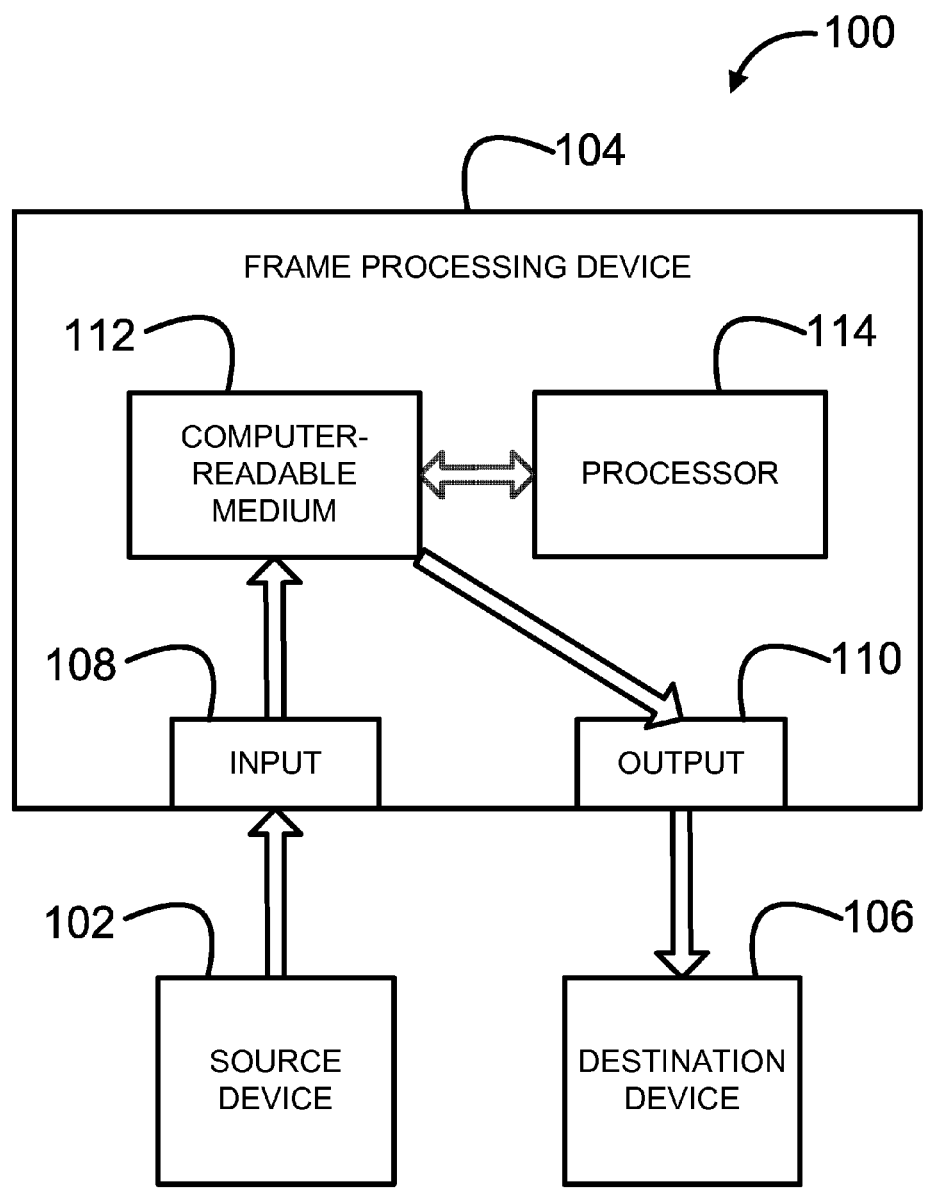
FIG. 1 is an example of a system in accordance with at least one embodiment.

Turning now to FIG. 1, an example system is provided and is generally designated 100. Included in the system 100 is a source device 102, a frame-processing device 104, and a destination device 106. Example source devices 102 include satellite receivers, decoders, baseband fiber transcoders, DVD players, Internet-delivery-based playout devices (e.g., Pathfire devices provided by DG FastChannel, Inc. of Irving, Tex.), and other frame-processing devices. The frame-processing device 104 includes a video input connection 108 and is configured for receiving video via the video input connection from the source device 102. In one embodiment, the frame-processing device 104 is configured for receiving raw baseband video based on the HD-SDI standard with a data transfer rate in the range of 1.4 Gbps-1.6 Gbps (and typically approximately 1.485 Gbps). Throughout this application, unless otherwise stated, all disclosed ranges are inclusive of the stated bound values. It is contemplated that the frame-processing device 104 is optionally configured for receiving video based on other standards, including but not limited to those defined by the Society of Motion Picture and Television Engineers ("SMPTE") as well as those of the ATSC.

A video output connection 110 on the frame-processing device 104 is configured for sending video to a destination device 106 (e.g., for playout of the video, and that may include the example source devices provided above). Further, the frame-processing device 104 includes a non-transitory computer-readable medium 112 and a processor 114. In the frame-processing device 104, the video input connection 108, the video output connection 110, the computer-readable medium 112, and the processor 114 may all be directly or indirectly electronically connected with one another. In the system 100, the frame-processing device 104, the source device 102, and the destination device 106, are all directly or indirectly electronically connected (in one embodiment via the video input connection 108 and the video output connection 110).

Figure 2A:
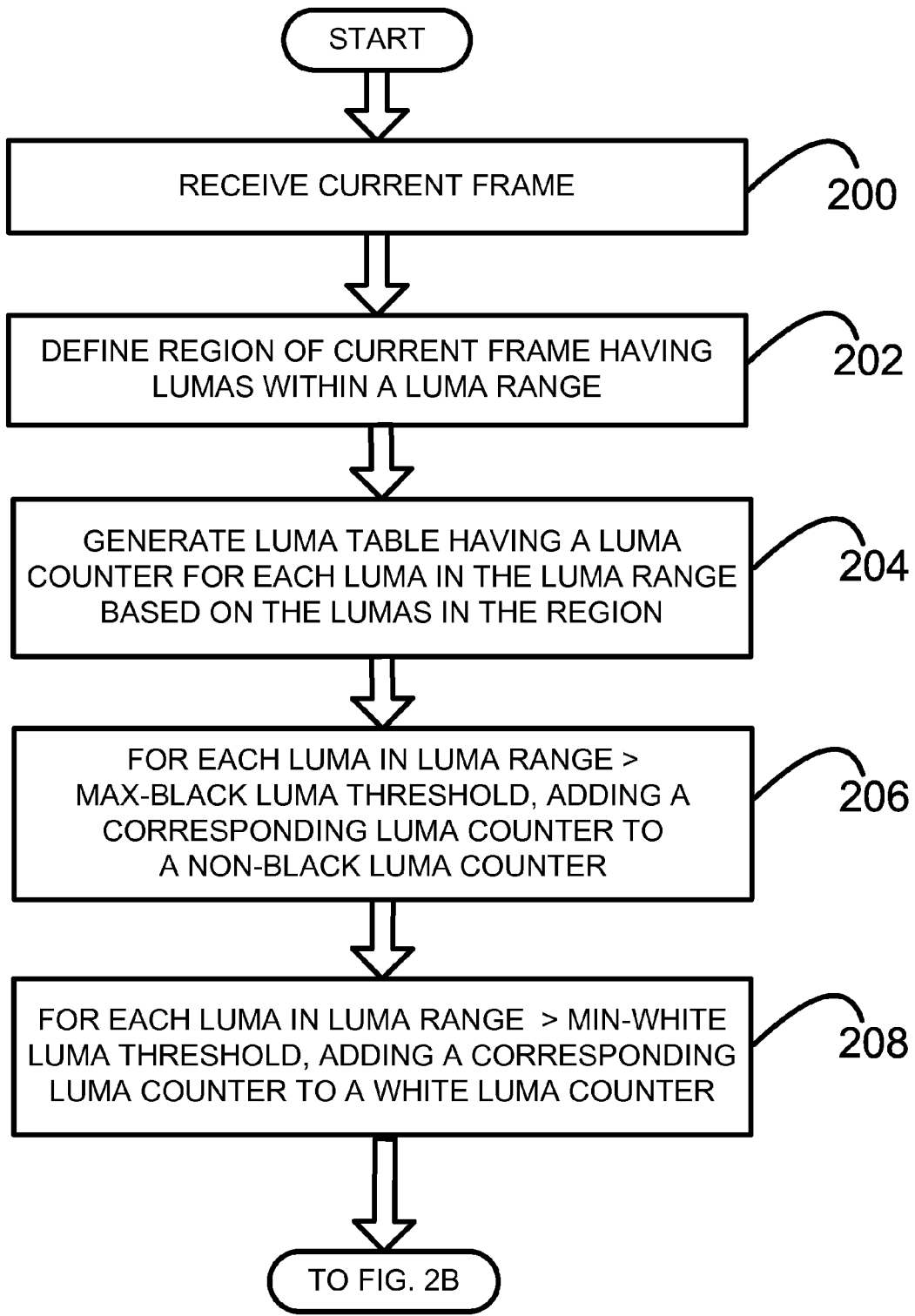
FIG. 2A is a first part of a flow chart illustrating an example of a method in accordance with at least one embodiment.
Figure 2B:
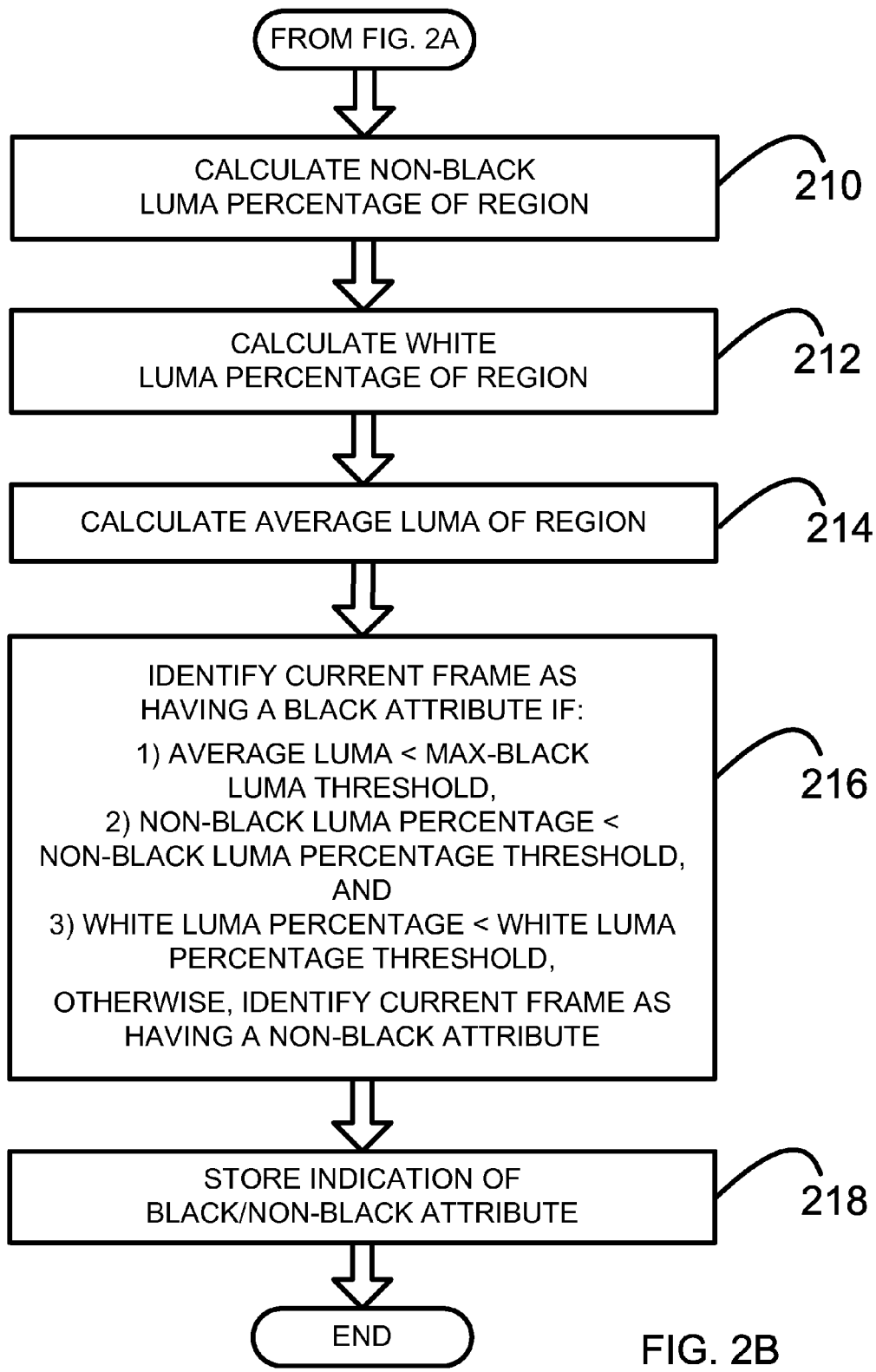
FIG. 2B is a second part of the flow chart of FIG. 2A.

The computer-readable medium 112 contains instructions that, when executed by the processor 114, cause a set of steps to be carried out for identifying a black/non-black attribute of a frame. Turning now to FIGS. 2A and 2B, a flow chart illustrating the set of steps, and an example of the present method embodiment, is shown. It is noted that the described steps throughout this application need not be performed in the disclosed order, although in some embodiments, an order of select steps is preferred. Also, not all steps need to be performed to achieve the desired advantages of the presently disclosed systems and methods, and therefore not all steps are required.

As discussed above, video includes a plurality of frames, and in one embodiment the present method is applied to each frame. However, for clarity, the present method will be described with reference to a "current" frame of the video being received from the source device 102 (e.g., as the source device plays out the video), and received by the frame-processing device 104 via the video input connection 108. In step 200, a current frame of the video is received. As discussed above, a frame is represented as a plurality of pixels, with each pixel having a luma value representing a level of brightness within a luma range. Unlike the traditional approaches where chrominance values are considered, the present method analyzes lumas to identify a black/non-black frame attribute. Such an approach reduces the use of system resources, as compared to, for example, the high processing power required to analyze chrominance values.

In some embodiments, the luma range may be defined by the video format. For example, 8-bit video may define a luma range of 0-255, while 10-bit video may define a luma range of 0-1023. However, in some instances, it may be desired to modify the defined luma range, such as to exclude so-called super-white and super-black levels that typically are not captured when the video is recorded. For example, for 10-bit video, a narrowed luma range of 64-940 may be used. In some embodiments, it may be desired to modify the defined luma range by using bit-shifting techniques. For example, by performing two right bit-shifts on the 10-bit video luma range of 0-1023, the luma range is reduced to 0-255. Among other things, this may allow for more efficient processing for calculations that involve luma values. For the described embodiments, this bit shifted luma range of 0-255 will be referenced (with 0 representing no brightness, i.e., completely black, and 255 representing full brightness, i.e., completely white), but as described above, different ranges are also contemplated and can be used.

In step 202, a region of the current frame is defined. An example of a current frame 300 and a corresponding region 302 are shown in FIG. 3 (not strictly drawn to scale). While the region 302 optionally includes the entire current frame 300, in one embodiment, the region 302 defines a lesser portion of the current frame 300. In one embodiment, the region 302 is a generally rectangular-shaped portion of the current frame 300 and is defined by a left-bound column, a right-bound column, a top-bound row, and a bottom-bound row. For a current frame 300 having a resolution of approximately 1,920×1,080, in one embodiment, the left-bound column is a value in a range 8-30, the right-bound column is a value in a range 1,890-1,912, the top-bound row is a value in a range 0-30, and the bottom-bound row is a value in a range 1,050-1,080, and in a more specific embodiment, the values are 10, 1,910, 10, and 1,070, respectively (thereby defining a region having a resolution of approximately 1,900×1,060).

For frames having alternative resolutions, the bound ranges and values may be modified as desired and/or appropriate. In some embodiments, such modification may include scaling (e.g., proportionally) the ranges and/or values. In other embodiments, it may be desired to increase the size of the region, while generally maintaining the proximity of the borders of the region to the borders of the frame (since this is where static and noise typically occurs). Indeed, the specific size and shape of the region may vary to suit the application.

Since the current frame 300 includes lumas associated with each pixel, the corresponding region 302 includes a more defined set of lumas that are used to generate a luma table. Use of the region 302 helps to filter out portions of the current frame 300 that are likely to be affected by static or noise and/or helps to reduce the use of system resources as less lumas need to be analyzed. Notably, static or noise often occurs near the edges, and particularly the left and right edges, of a frame (e.g., as a result of clock heterodyne artifacts resulting from older transmission methods).

Figures 4, 5:
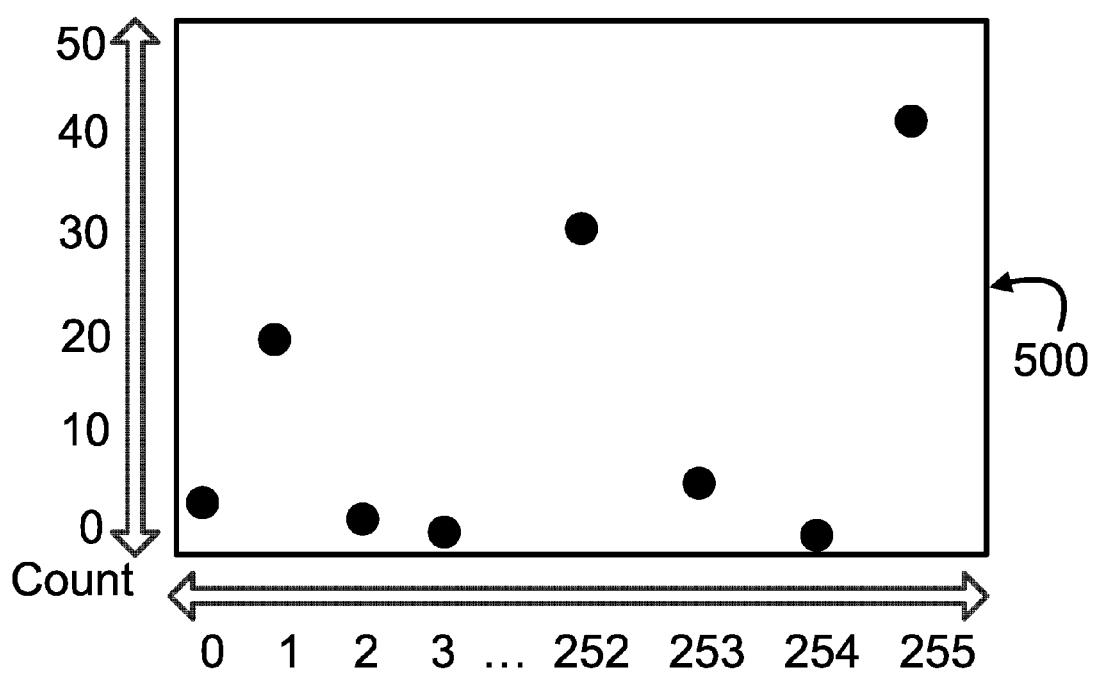
FIG. 4 depicts an example of a luma table in accordance with at least one embodiment.
FIG. 5 depicts an example of a graphical representation of the luma table of FIG. 4.

In step 204, a luma table is generated that has a luma counter for each luma in the luma range based on the lumas in the region 302. An example luma table 400 and a corresponding graphical representation 500 for the current frame 300 are shown in FIGS. 4 and 5, respectively. To maximize efficiency, preferably the luma table 400 is stored in a register memory (e.g., cache) included on the processor 114. Such a configuration greatly improves the speed at which values in the luma table 400 are retrieved, thereby increasing the execution speed of the present method.

Using the luma table 400, a non-black luma counter is calculated, where the non-black luma counter represents a count of lumas that exceed a max-black luma threshold. For a luma range 0-255, in one embodiment the max-black luma threshold is a value in a range 27-37, and in at least one embodiment is 32. To calculate the non-black luma counter, it is first initialized (e.g., set to 0), and in step 206, for each luma in the luma range that is greater than the max-black luma threshold, a corresponding luma value counter (identified in the luma value table) is added to the non-black luma counter. In one embodiment, all disclosed threshold values and ranges are predetermined (i.e., before performance of the steps in the present method).

Similarly, using the luma table 400, a white luma counter is calculated, where the white luma counter represents the number of lumas that exceed a min-white luma threshold. For a luma range 0-255, in one embodiment, the min-white luma threshold is a value in a range 59-69, and in at least one embodiment is 64. To calculate the white luma counter, it is first initialized (e.g., set to 0), and in step 208, for each luma in the luma range that is greater than the min-white luma threshold, a corresponding luma value counter (identified in the luma value table) is added to the white luma counter. Notably, the disclosed ranges and values for the max-black and min-white luma thresholds are preferred for frames having a luma range 0-255. For frames having alternative luma ranges, the max-black and min-white luma thresholds may be scaled (e.g., proportionally) accordingly.

Next, the non-black and white luma counters are converted to respective percentages of the region 302. In step 210, a non-black luma percentage of the region 302 is calculated based on the non-black luma counter. In one embodiment, the non-black luma percentage is calculated by dividing the non-black luma counter by a total luma count for the region 302. Similarly, in step 212, a white luma percentage of the region 302 is calculated based on the white luma counter. In at least one embodiment, the white luma percentage is calculated by dividing the white luma counter by the total luma count for the region 302. Notably, while the above-described calculations may be used, they need not be performed based on the described strict calculations (i.e., calculating the identified percentages may be achieved using alternate functions). Further, as used herein the term "percentage" is not limited to a number represented as a fraction of one hundred, but instead refers to any expression of a quantity relative to another quantity, and may include for example, a ratio.

In step 214, an average luma value is calculated based on the lumas in the region 302. Again, while an arithmetic average calculation may be used, such strictness need not be applied in making such a calculation, and therefore alternate functions can be used.

In step 216, the current frame is identified as having a black attribute if at least one, and in one embodiment three, conditions are tested and satisfied. The first condition is that the average luma is less than the max-black luma threshold. This first condition ensures that the current frame 300 is, on average, sufficiently black. Applying this condition typically results in dropping the vast majority of frames from consideration (i.e., resulting in such frames being identified as having a non-black attribute). Frames that may satisfy this condition include for example, both "genuine" black frames that are intended to be identified as having a black frame attribute, and frames that despite having a low average luma, contain at least some substantive content, and therefore are intended to be identified as having a non-black frame attribute. This latter type of frame may include, for example, a frame showing a gray moon on a black background, or a frame showing white movie credits on a black background. While such frames have a low average luma (due to the predominately black background, and in the case of the moon example, where the low luma values represent the moon), they are not intended to be identified as having a black frame attribute. Such frames are addressed by the second and third conditions as discussed below.

The second condition is that the non-black luma percentage is less than a non-black luma percentage threshold, which for high definition frames in at least one embodiment is a value in a range 0.8-2.2%, and in at least one embodiment is approximately 1.0% or 2.0% (the determination of an appropriate value is discussed in greater detail below). This condition assists in dropping frames from consideration that, despite satisfying the first condition, contain traditionally substantive content. For example, consider the example frame described above, namely where the frame shows a gray moon on a black background. While the average luma of the frame may be low, the gray portions of the moon are likely to be deemed non-black (i.e., since the corresponding lumas exceed the max-black luma threshold) and are likely to represent a substantial enough percentage of the frame such that the percentage is greater than the non-black luma percentage threshold. Therefore, by testing the second condition, this example frame fails to satisfy the second condition, and is therefore identified as having a non-black frame attribute.

Notably, the non-black luma percentage threshold as discussed above in one embodiment is set based on characteristics of the video. For example, select video, such as that typically represented in a high definition format (e.g., 1,920× 1,080), is less likely to have experienced format conversions (as compared to low definition formats that often have an analog lineage) or other modifications and therefore is less likely to have static or noise. As such, the non-black luma percentage threshold in one embodiment is lower (resulting in a stricter tolerance), such as in a range from 1.5% to 2.0%, and in one embodiment approximately 1.0%. For video that likely encountered format conversions or other modifications and/ or that has a relatively lower resolution, such as that represented in a standard definition frame (e.g., 640×480), the non-black luma percentage threshold in one embodiment is higher, such as in a range 1.5% to 2.5%, and in one embodiment approximately 2.0% to loosen the tolerance and allow for the additional static or noise.

Now consider another example frame as described above, namely where the frame shows white movie credits on a black background. If the amount of text represents a large enough percentage of the frame, the frame will similarly fail to satisfy the second condition, and will be identified as having a non-black frame attribute. However, a frame having only a small amount of text (e.g., one line of movie credits or text with a generally thin font), and therefore a small percentage of non-black lumas, may still satisfy the second condition. Such frames are addressed by the third condition as discussed below.

The third condition is that the white luma percentage is less than a white luma percentage threshold, which in at least one embodiment is a value in a range 1.8-2.2%, and in at least one embodiment is approximately 2.0%. This condition assists in dropping frames that, despite satisfying the first and second conditions, contain substantive content. For example, consider the example frame showing a relatively small number of white movie credits on a black background. Since the credits make up a relatively small portion of the frame, the frame may satisfy the first and second conditions as described above, but of course the frame is not intended to be identified as having a black frame attribute (since, e.g., the frame is not a logical boundary between VCs). The white luma percentage threshold (e.g., approximately 2.0%) is low enough such that white lumas resulting from static or noise are unlikely to be considered as white text, thereby allowing "genuine" black frames to be identified as having a black frame attribute (i.e., when all three conditions are satisfied). However, the white luma percentage threshold is set such that even a relatively small amount of sufficiently bright text (with corresponding lumas exceeding the min-white luma threshold) is likely to result in the white luma percentage exceeding the white luma percentage threshold, thereby identifying the frame as having a non-black attribute. Further, since it is the brightness and not the chrominance value of the frame that is analyzed, the third condition drops frames containing not only white text, but also other sufficiently bright text (that may be, e.g., yellow).

To maximize efficiency, in one embodiment short-circuiting logic techniques are employed when testing the above-described conditions. As such, if one condition is not satisfied, the remaining conditions are not tested and the frame is identified as having a non-black attribute. Accordingly, in one embodiment the three conditions are tested in the order recited, although notably such an order is not required. In step 218, an indication of the associated black/non-black attribute is stored in a memory (e.g., in the computer-readable medium 112) for, among other things, later retrieval and use by other applications. As such, if the frame is identified as having a black attribute, an indication of a black attribute is stored. Likewise, if the frame is identified as having a non-black attribute, an indication of a non-black attribute is stored.

In one embodiment, the steps of the present method are performed on each frame of baseband video as it is received via the video input connection 108 in real time or near real time. Such a configuration provides for performing the above-described steps while contemporaneously processing each frame to create an encoded file representing the video. Notably, when processing frames in real time or near real time (e.g., through use of a frame buffer), there is an inherent limitation in that the above-described steps applied to a current frame must be performed during an execution time period that is less than a reciprocal of the frame rate of the video (e.g., the steps of the present method must be performed within 1/29.97 seconds for video having a frame rate of 29.97 frames per second). Such time constraints present considerable challenges, particularly when the video is being transferred at a high data rate as the amount of data and the complexity of the calculations carried out by the processor 114 increase. However, due at least in part to the various optimization techniques as described throughout this disclosure, the steps of the present method can be performed within limited time constraints and/or with a reduced use of system resources.

Notably, a frame-attribute table (or other data structure such as a linked list) may be used to store the indication of the associated black/non-black attribute in a memory as described above. As such, in one embodiment, a table may store such indications for all frames of a video package. Further, a separate frame-transition table may also be generated that indicates attribute changes or transitions between frames (e.g. the transition from a frame A having a black attribute to a frame B having a non-black-attribute may be indicated as a from-black transition).

As one example of the efficiency of the present method, testing shows that the steps of the present method are capable of being performed contemporaneously while processing each frame for video based on the HD-SDI standard (i.e., having a transfer rate of approximately 1.485 Gbps and a frame rate of 29.97 frames per second) using a quad-core processor, with each core having a speed of 2 GHz (e.g., a Xeon E5405 processor provided by Intel® of Santa Clara, Calif.).

In addition to the DVR commercial-skipping application described above, another particularly beneficial application of the presently disclosed systems and methods is for use with systems and methods for electronically tagging a VC in a video package as described in the cross-referenced U.S. patent application Ser. No. 13/629,497. As discussed therein, the ability to identify a black/non-black frame attribute with minimal processing power and in real-time or near real-time is particularly advantageous as select embodiments of the disclosed systems and methods for electronically tagging a VC in a video package rely not only on the identification of black/non-black frame attributes, but also on the identification of several other frame attributes, that when combined, are restricted by the frame-rate time constraints as described above.

Notably, in alternative embodiments, video may also be obtained by decompressing and/or decoding an encoded file such as may be stored on the computer-readable medium 112, or stored on the source device 102. In addition, in alternate embodiments, the steps of the present method may be performed on each frame after baseband video is received from a video input connection 108 and processed and/or stored.

Although the presently disclosed systems and methods have been described in terms of select embodiments, alterations and permutations of these embodiments will be apparent to those skilled in the art. Accordingly, the above description of example embodiments does not define or constrain the presently disclosed systems and methods.

In particular, it is noted that while some specific embodiments have been described using particular applied algorithms, the presently disclosed systems and methods should not be construed as being limited to those particular implementations. For example, descriptions of iterative techniques can be implemented using recursive techniques, and vice-versa. Further, serial and parallel implementations can be interchanged. Similarly, it is contemplated that the use of logical structures including loops and condition statements can be modified, interchanged, or restricted without departing from the presently disclosed systems and methods. Finally, it is contemplated that alternative data structure and storage techniques may be employed in implementing the techniques employed in the presently disclosed system and method (e.g., data stored in a table may instead be stored in a linked-list, tree, or other data structure). Other changes, substitutions, and alterations are also possible without departing from the presently disclosed systems and methods in their broader aspects as set forth in the following claims.

The invention claimed is:

1. A non-transitory computer-readable medium containing instructions that, when executed by a processor, cause a set of steps to be carried out for identifying a black/non-black attribute of a current frame, said set comprising:
   receiving the current frame;
   defining a region of the current frame, the region having a plurality of lumas within a luma range;
   calculating a non-black luma percentage of said region based on said lumas;
   calculating a white luma percentage of said region based on said lumas;
   calculating an average luma of said region based on said lumas;
   identifying the current frame as having a black attribute responsive to three conditions being satisfied, the first of the three conditions being that said average luma is less than a max-black luma threshold, the second of the three conditions being that said non-black luma percentage is less than a non-black luma percentage threshold, and the third of the three conditions being that said white luma percentage is less than a white luma percentage threshold; and
   storing an indication of an associated black/non-black frame attribute in a memory.

2. The computer-readable medium of claim 1, wherein said set further comprises the steps of:
   generating a luma table having a luma counter for each luma in said luma range based on said lumas in said region;
   for each said luma in said luma range greater than said max-black luma threshold, adding a corresponding luma counter to a non-black luma counter; and
   for each said luma in said luma range greater than a min-white luma threshold, adding a corresponding luma counter to a white luma counter,
   wherein said non-black luma percentage is calculated based on said non-black luma counter and a total luma count of said region, and
   wherein said white luma percentage is calculated based on said white luma counter and said total luma count of said region.

3. The computer-readable medium of claim 2, wherein said luma table is stored in a register memory included on the processor.

4. The computer-readable medium of claim 1, wherein said computer-readable medium is included in a frame-processing device having a video input connection and configured to receive, via the video input connection, baseband video having a plurality of frames, and wherein said computer-readable medium is electronically connected to said video input connection.

5. The computer-readable medium of claim 4, wherein said computer-readable medium is configured for contemporaneously processing each frame to create an encoded file while performing said set of steps for each frame, and wherein performance of said steps for each frame occurs during an execution time period that is less than a reciprocal of a frame rate of the video.

6. The computer-readable medium of claim 5, wherein the video is received at a transfer rate of 1.485 Gbps, and said execution time period is less than or equal to approximately 1/29.97 seconds.

7. The computer-readable medium of claim 1, wherein said computer-readable medium is electronically connected to a source device and configured to receive video having a plurality of frames, the video being stored as an encoded file on the source device, wherein said computer-readable medium is configured to decode each frame and perform said steps for each frame.

8. The computer-readable medium of claim 1, wherein said region is a generally rectangular-shaped portion of the current frame.

9. The computer-readable medium of claim 8, wherein said region is defined by a left-bound column, a right-bound column, a top-bound row, and a bottom-bound row.

10. The computer-readable medium of claim 9, wherein the current frame includes a row count of 1,080 and a column count of 1,920, both defining a resolution of the current frame, and wherein said left-bound column is a value in a range 8-30, said right-bound column is a value in a range 1,890-1,912, said top-bound row is a value in a range 0-30, and said bottom-bound row is a value in a range 1,050-1,080.

11. The computer-readable medium of claim 1, wherein said luma range is 0-255, said max-black luma threshold is a value in a range 27-37, and a min-white luma threshold is a value in a range 59-69.

12. The computer-readable medium of claim 1, wherein said max-black luma threshold and a min-white luma threshold are scaled proportionally according to said luma range.

13. The computer-readable medium of claim 1, wherein said non-black luma percentage threshold is a value in a range 0.8%-1.2% or 1.8%-2.2% and said white luma percentage threshold is a value in a range 1.8%-2.2%.

14. The computer-readable medium of claim 1, wherein in said identifying step, the current frame is identified as having a non-black attribute if the current frame is not identified as having a black attribute.

15. The computer-readable medium of claim 1, wherein the first, second, and third conditions recited in said identifying step are configured to be tested in the order recited, and are further configured to employ a short-circuiting logic technique.

16. A frame-processing device, comprising:
a processor; and
a non-transitory computer-readable medium electronically connected to said processor, and containing instructions that, when executed by said processor, cause a set of steps to be carried out for identifying a black/non-black frame attribute of a current frame, said set comprising:
receiving the current frame;
defining a region of the current frame, the region having a plurality of lumas within a luma range;
calculating a non-black luma percentage of said region based on said lumas;
calculating a white luma percentage of said region based on said lumas;
calculating an average luma of said region based on said lumas; and
identifying the current frame as having a black attribute responsive to three conditions being satisfied, the first of the three conditions being that said average luma is less than a max-black luma threshold, the second of the three conditions being that said non-black luma percentage is less than a non-black luma percentage threshold, and the third of the three conditions being that said white luma percentage is less than a white luma percentage threshold; and
storing an indication of an associated black/non-black frame attribute in a memory.

17. The frame-processing device of claim 16, wherein said processor includes a memory, and wherein said set further comprises the steps of:
generating a luma table having a luma counter for each luma in said luma range based on said lumas in said region;
storing said luma table in said memory;
for each said luma in said luma range greater than said max-black luma threshold, adding a corresponding luma counter to a non-black luma counter; and
for each said luma in said luma range greater than a min-white luma threshold, adding a corresponding luma counter to a white luma counter,
wherein said non-black luma percentage is calculated based on said non-black luma counter and a total luma count of said region, and
wherein said white luma percentage is calculated based on said white luma counter and said total luma count of said region.

18. The frame-processing device of claim 16, further comprising an input video connection electronically connected to said processor and said computer-readable medium, wherein said frame-processing device is configured to receive, via said video input connection, baseband video having a plurality of frames, wherein said computer-readable medium is further configured for contemporaneously processing each frame to create an encoded file while performing said steps for each frame, and wherein performance of said steps for each frame occurs during an execution time period that is less than a reciprocal of a frame rate of the video.

19. The frame-processing device of claim 16, wherein said region is a generally rectangular-shaped portion of the current frame, wherein said region is defined by a left-bound column, a right-bound column, a top-bound row, and a bottom-bound row, wherein the current frame includes a row count of 1,080 and a column count of 1,920, both defining a resolution of the current frame, and wherein said left-bound column is a value in a range 8-30, said right-bound column is a value in a range 1,890-1,912, said top-bound row is a value in a range 0-30, and said bottom-bound row is a value in a range 1,050-1,080.

20. A method of identifying a black/non-black attribute of a current frame, the method comprising the steps of:
receiving the current frame from a source device;
defining a region of the current frame, the region having a plurality of lumas within a luma range;
calculating a non-black luma percentage of said region based on said lumas;
calculating a white luma percentage of said region based on said lumas;
calculating an average luma of said region based on said lumas;
identifying the current frame as having a black attribute responsive to three conditions being satisfied, the first of the three conditions being that said average luma is less than a max-black luma threshold, the second of the three conditions being that said non-black luma percentage is less than a non-black luma percentage threshold, and the third of the three conditions being that said white luma percentage is less than a white luma percentage threshold; and
storing an indication of an associated black/non-black frame attribute in a memory.

* * * * *